United States Patent
Bai et al.

(10) Patent No.: US 10,236,394 B2
(45) Date of Patent: Mar. 19, 2019

(54) THIN FILM TRANSISTOR, ARRAY SUBSTRATE, AND DISPLAY APPARATUS, AND FABRICATION METHODS THEREOF

(71) Applicants: BOE TECHNOLOGY GROUP CO., LTD., Beijing (CN); BEIJING BOE DISPLAY TECHNOLOGY CO., LTD., Beijing (CN)

(72) Inventors: Jinchao Bai, Beijing (CN); Huibin Guo, Beijing (CN); Xiangqian Ding, Beijing (CN); Jing Wang, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/741,753

(22) PCT Filed: Jan. 25, 2017

(86) PCT No.: PCT/CN2017/072637
§ 371 (c)(1),
(2) Date: Jan. 3, 2018

(87) PCT Pub. No.: WO2017/197923
PCT Pub. Date: Nov. 23, 2017

(65) Prior Publication Data
US 2018/0197998 A1    Jul. 12, 2018

(30) Foreign Application Priority Data
May 17, 2016 (CN) .......................... 2016 1 0327734

(51) Int. Cl.
*H01L 27/12* (2006.01)
*H01L 29/786* (2006.01)
*H01L 21/223* (2006.01)
*H01L 29/66* (2006.01)
*H01L 29/417* (2006.01)

(52) U.S. Cl.
CPC ...... *H01L 29/78696* (2013.01); *H01L 21/223* (2013.01); *H01L 27/124* (2013.01);
(Continued)

(58) Field of Classification Search
None
See application file for complete search history.

(56) References Cited

U.S. PATENT DOCUMENTS 8,343,858 B2 * 1/2013 Tanaka ............... H01L 31/03685
438/488
2006/0024866 A1   2/2006 Gan et al.
(Continued)

FOREIGN PATENT DOCUMENTS

CN    102074502 A    5/2011
CN    102651399 A    8/2012
(Continued)

OTHER PUBLICATIONS

International Search Report & Written Opinion dated May 4, 2017, regarding PCT/CN2017/072637.
(Continued)

*Primary Examiner* — Benjamin P Sandvik
(74) *Attorney, Agent, or Firm* — Westerman, Hattori, Daniels & Adrian, LLP

(57) ABSTRACT

The present application discloses A thin film transistor (TFT), including: a substrate; a source-drain layer comprising a source electrode and a drain electrode over the substrate; and an active layer comprising a poly-Si pattern and an amorphous-Si pattern having contact with the poly-Si pattern over the substrate. The amorphous-Si pattern is between the poly-Si pattern and the source-drain layer; the source electrode overlaps with the poly-Si pattern and the amorphous-Si pattern respectively in a direction substantially perpendicular to a surface of the substrate; and the (Continued)

drain electrode overlaps with the poly-Si pattern and the amorphous-Si pattern respectively in the direction substantially perpendicular to the surface of the substrate.

19 Claims, 10 Drawing Sheets

(52) U.S. Cl.
CPC ...... *H01L 27/1229* (2013.01); *H01L 27/1288* (2013.01); *H01L 29/41733* (2013.01); *H01L 29/66765* (2013.01); *H01L 29/78618* (2013.01); *H01L 29/78669* (2013.01); *H01L 29/78678* (2013.01)

(56) References Cited

U.S. PATENT DOCUMENTS

| | | | |
|---|---|---|---|
| 2009/0224247 A1* | 9/2009 | Kaitoh | H01L 27/1229 257/59 |
| 2010/0176399 A1* | 7/2010 | Takeguchi | H01L 29/4908 257/57 |
| 2012/0211809 A1 | 8/2012 | Tanaka et al. | |
| 2013/0037806 A1* | 2/2013 | Hayashi | H01L 29/78669 257/57 |
| 2013/0119391 A1* | 5/2013 | Kanegae | H01L 29/786 257/66 |
| 2015/0129868 A1* | 5/2015 | Kim | H01L 21/32134 257/43 |

FOREIGN PATENT DOCUMENTS

| | | |
|---|---|---|
| CN | 105390551 A | 3/2016 |
| CN | 205609532 U | 9/2016 |
| JP | 5-55570 A | 3/1993 |

OTHER PUBLICATIONS

Office Action dated Jun. 26, 2018, issued in counterpart Chinese Application No. 201610327734.X, with English translation (15 pages).

\* cited by examiner

THIN FILM TRANSISTOR, ARRAY SUBSTRATE, AND DISPLAY APPARATUS, AND FABRICATION METHODS THEREOF

CROSS-REFERENCE TO RELATED APPLICATION

This application is a national stage application under 35 U.S.C. § 371 of International Application No. PCT/CN2017/072637, filed Jan. 25, 2017, which claims priority to Chinese Patent Application No. 201610327734.X, filed on May 17, 2016, the contents of which are incorporated by reference in the entirety.

TECHNICAL FIELD

The present invention generally relates to display technology, more particularly, relates to a thin film transistor, an array substrate, and a display apparatus, and their fabrication methods.

BACKGROUND

In display technology, a pixel unit in a display apparatus often includes a thin film transistor (TFT). The TFTs can drive the pixel units to display images.

A TFT can be an a-Si (amorphous silicon) TFT. An a-Si TFT often includes: a substrate, and a gate electrode, a gate insulating layer, an active layer, and a source-drain layer formed on the substrate. The active layer includes an a-Si layer, made from a-Si material. The source-drain layer includes a source electrode and a drain electrode, and each has a contact with the a-Si layer. The drain electrode also has a contact with the pixel electrode in the pixel unit. The gate electrode can control the on and off states of the TFT. When the TFT is switched on, current may flow from the source electrode, through the a-Si layer and the drain layer, to the pixel electrode, to charge a pixel electrode.

The conventional technology has at least the following issues: because the source electrode and the drain electrode each contacts the a-Si layer, when charging the pixel electrode, the current from the source electrode of the TFT needs to flow through the a-Si layer to reach the drain electrode. The electron mobility of the a-Si is relatively low. As a result, the on-state current of the a-Si TFT is relatively low, and the charging rate is undesirably low.

SUMMARY

In one aspect, the present invention provides a thin film transistor (TFT), including: a substrate; a source-drain layer comprising a source electrode and a drain electrode over the substrate; and an active layer comprising a poly-Si pattern and an amorphous-Si pattern having contact with the poly-Si pattern over the substrate. The amorphous-Si pattern is between the poly-Si pattern and the source-drain layer. The source electrode overlaps with the poly-Si pattern and the amorphous-Si pattern respectively in a direction substantially perpendicular to a surface of the substrate. The drain electrode overlaps with the poly-Si pattern and the amorphous-Si pattern respectively in the direction substantially perpendicular to the surface of the substrate.

Optionally, an orthogonal projection of the amorphous-Si pattern on the substrate is within an orthogonal projection of the poly-Si pattern on the substrate.

Optionally, a first portion of the poly-Si pattern is covered by the amorphous-Si pattern in the direction substantially perpendicular to the surface of the substrate and a second portion of the poly-Si pattern is exposed by the amorphous-Si pattern in the direction substantially perpendicular to the surface of the substrate; and a first portion of the source electrode overlaps with the first portion of the poly-Si pattern and a second portion of the source electrode overlaps with the second portion of the poly-Si pattern, and a first portion of the drain electrode overlaps with the first portion of the poly-Si pattern and a second portion of the drain electrode overlaps with the second portion of the poly-Si pattern.

Optionally, the source electrode is in contact with the poly-Si pattern and the amorphous-Si pattern respectively, and the drain electrode is in contact with the poly-Si pattern and the amorphous-Si pattern respectively.

Optionally, the TFT further includes an ohmic contact layer comprising a source contact pattern and a drain contact pattern between the active layer and the source-drain layer. The source contact pattern is in contact with each of the source electrode, the poly-Si pattern, and the amorphous-Si pattern, and the drain contact pattern is in contact with each of the drain electrode, the poly-Si pattern, and the amorphous-Si pattern.

Optionally, an orthogonal projection of the source contact pattern on the substrate substantially overlaps with an orthogonal projection of the source electrode on the substrate; an orthogonal projection of the drain contact pattern on the substrate substantially overlaps with an orthogonal projection of the drain electrode on the substrate.

Optionally, the source contact pattern and the drain contact pattern are made of a material including n+ amorphous-Si.

Optionally, the TFT, further includes a gate electrode. An orthogonal projection of the poly-Si pattern on the substrate substantially overlaps with an orthogonal projection of the gate electrode.

Another aspect of the present disclosure provides an array substrate, including a disclosed TFT.

Another aspect of the present disclosure provides a display apparatus, including the disclosed array substrate.

Another aspect of the present disclosure provides a method for forming a thin film transistor (TFT), including: forming a substrate; forming a source-drain layer having a source electrode and a drain electrode over the substrate; and forming an active layer comprising a poly-Si pattern and an amorphous-Si pattern having contact with the poly-Si pattern over the substrate. The amorphous-Si pattern is between the poly-Si pattern and the source-drain layer, the source electrode overlaps with the poly-Si pattern and the amorphous-Si pattern respectively in a direction substantially perpendicular to a surface of the substrate; and the drain electrode overlaps with the poly-Si pattern and the amorphous-Si pattern respectively in the direction substantially perpendicular to the surface of the substrate.

The method further includes: forming an ohmic contact layer having a source contact pattern and a drain contact pattern between the active layer and the source-drain layer. The source contact pattern is in contact with each of the source electrode, the poly-Si pattern, and the amorphous-Si pattern, and the drain contact pattern is in contact with each of the drain electrode, the poly-Si pattern, and the amorphous-Si pattern.

Optionally, forming the active layer over the substrate includes: forming a poly-Si layer on the substrate; forming a first amorphous-Si layer over the poly-Si layer; performing a patterning process on the first amorphous-Si layer to form the amorphous-Si pattern; sequentially forming an ohmic contact material layer and a source-drain metal layer over the amorphous-Si pattern; and performing a patterning process over the source-drain metal layer, the ohmic contact material layer, and the poly-Si layer to form the source-drain layer, the source contact pattern, the drain contact patter, and the poly-Si pattern.

Optionally, performing a patterning process over the source-drain metal layer, the ohmic contact material layer, and the poly-Si layer to form the source-drain layer, the source contact pattern, the drain contact pattern, and the poly-Si pattern includes: forming a photoresist layer over the source-drain metal layer; applying a halftone mask over the photoresist layer to obtain a photoresist pattern, the photoresist pattern including a first photoresist region, a second photoresist region, and a photoresist-fully-removed region, the first photoresist region corresponding to a to-be-formed source-drain layer, the second photoresist region corresponding to a region between the source electrode and the drain electrode in the to-be-formed source-drain layer, and the photoresist-fully-removed region corresponding to other regions; performing an etching process on a portion of the source-drain metal layer, the ohmic contact material layer and the poly-Si layer each corresponding to the photoresist-fully-removed region, to obtain an initial ohmic contact pattern, an initial source-drain layer and the poly-Si pattern; removing photoresist in the second photoresist region; performing an etching process on a portion of the initial source-drain layer and the initial ohmic contact pattern each corresponding to the second photoresist region, to obtain the source-drain layer, the drain contact pattern, and the source contact pattern; and removing photoresist in the first photoresist region.

Optionally, forming a poly-Si layer over the substrate includes: forming a second amorphous-Si layer on the substrate; performing a high-temperature dehydrogenation process on the second amorphous-Si layer, to form a post-dehydrogenated second amorphous-Si layer; and performing an annealing process on the post-dehydrogenated second amorphous-Si layer, to convert amorphous-Si in the post-dehydrogenated second amorphous-Si layer to poly-Si to obtain the poly-Si layer.

Optionally, performing an annealing process on the post-dehydrogenated second amorphous-Si layer, to convert amorphous-Si in the post-dehydrogenated second amorphous-Si layer to poly-Si to obtain the poly-Si layer includes: performing the annealing process on a region of the post-dehydrogenated second amorphous-Si layer that is corresponding to a gate electrode to convert amorphous-Si in the region to poly-Si and obtain the poly-Si layer, the poly-Si layer including a poly-Si region and an amorphous-Si region, wherein an orthogonal projection of the photoresist-fully-removed region on the substrate substantially overlaps with an orthogonal projection of the amorphous-Si region on the substrate.

Optionally, an orthogonal projection of the amorphous-Si pattern on the substrate is located within an orthogonal projection of the poly-Si pattern on the substrate; an orthogonal projection of the source contact pattern on the substrate substantially overlaps with an orthogonal projection of the source electrode on the substrate; and an orthogonal projection of the drain contact pattern on the substrate substantially overlaps with an orthogonal projection of the drain electrode on the substrate.

Optionally, the source contact pattern and the drain contact pattern are made of a material including n+ amorphous-Si.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now describe more specifically with reference to the following embodiments. It is to be noted that the following descriptions of some embodiments are presented herein for purpose of illustration and description only. It is not intended to be exhaustive or to be limited to the precise form disclosed.

Embodiments of the present disclosure provide a thin film transistor (TFT), an array substrate, and a display apparatus, and their fabrication methods.

Figure 1:
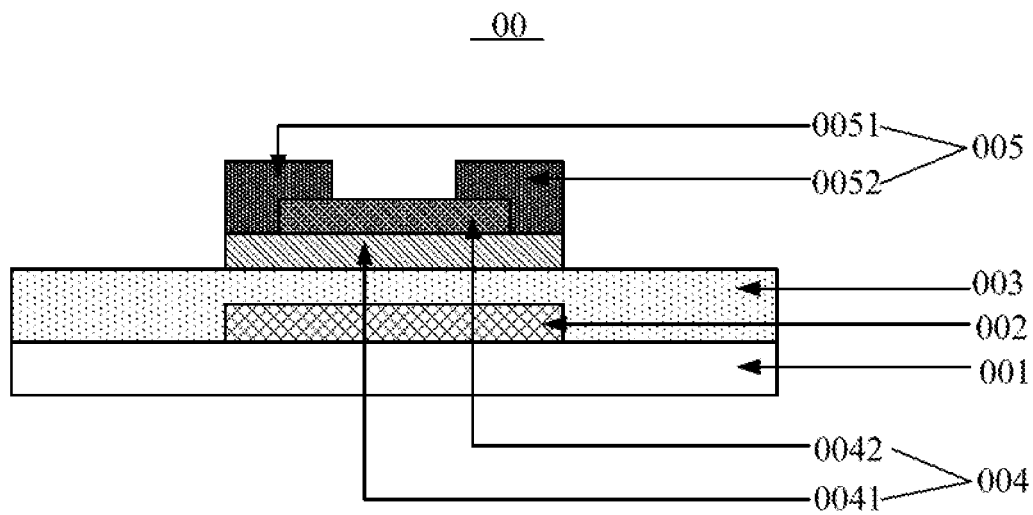
FIG. 1 illustrates an exemplary TFT according to various disclosed embodiments of the present disclosure.

FIG. 1 illustrates an exemplary structure of a disclosed TFT 00. As shown in FIG. 1, the TFT 00 may include a substrate 001. The substrate 001 may be transparent, and may be made of a suitable solid non-metal material having a desired light transmission rate and desired hardness. For example, the substrate 001 may be made of glass, quartz, transparent resin, and other suitable materials.

A gate electrode 002 may be formed over the substrate 001. A gate insulating (GI) layer 003 may be formed over the gate electrode 002 on the substrate 001. An active layer 004 and a source-drain layer 005 may be formed over the substrate 001 that is formed with the GI layer 003. The active layer 004 may include a poly-silicon (p-Si) pattern 0041 and an amorphous silicon (a-Si) pattern 0042 over the poly-Si pattern 0041.

The source-drain layer 005 may include a source electrode 0051 and a drain electrode 0052. The source electrode 0051 may have contact with the poly-Si pattern 0041 and the a-Si pattern 0042. The drain electrode 0052 may have contact with the poly-Si pattern 0041 and the a-Si pattern 0042.

As described above, in the disclosed TFT, the source and the drain may each have a contact with the poly-Si pattern and the a-Si pattern, and when the TFT is turned on, the current from the source electrode may flow through the poly-Si pattern to reach the drain electrode. Because the electron mobility of the poly-Si pattern is sufficiently high, the on-state current of the TFT may be increased, and the charging rate may be increased accordingly. The issues of low on-state current and low charging rate in the conventional TFT may be resolved. Thus, the on-state current of the TFT may be increased, and the charging rate may be improved.

Figure 2:
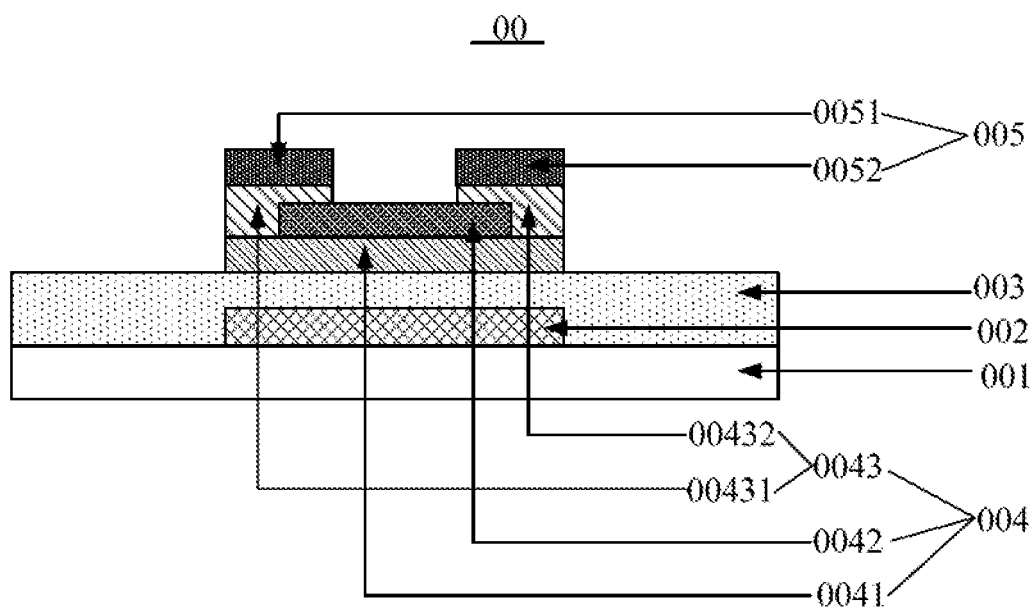
FIG. 2 illustrates another exemplary TFT according to various disclosed embodiments of the present disclosure.

FIG. 2 illustrates another exemplary structure of the disclosed TFT 00. As shown in FIG. 2, the TFT 00 may include a substrate 001. The substrate 001 may be transparent, and may be made of a suitable solid non-metal material having a desired light transmission rate and desired hardness. For example, the substrate 001 may be made of glass, quartz, transparent resin, and other suitable materials.

A gate electrode 002 may be formed over the substrate 001. A GI layer 003 may be formed over the gate electrode 002 on the substrate 001. An active layer 004 and a source-drain layer 005 may be formed over the GI layer 003 on the substrate 001. The active layer 004 may include a poly-Si pattern 0041 and an a-Si pattern 0042 over the poly-Si pattern 0041.

The source-drain layer 005 may include a source electrode 0051 and a drain electrode 0052. The source electrode 0051 may be in contact with the poly-Si pattern 0041 and the a-Si pattern 0042. The drain electrode 0052 may be in contact with the poly-Si pattern 0041 and the a-Si pattern 0042.

Further, as shown in FIG. 2, the active layer 004 may also include an ohmic contact pattern 0043 over the a-Si pattern 0042 and the poly-Si pattern 0041. The material of the ohmic contact pattern 0043 may include n+ a-Si. The ohmic contact pattern 0043 may include a source contact pattern 00431 and a drain contact pattern 00432. The source contact pattern 00431 may correspond to (or be directly under) the source electrode 0051, and the source contact pattern 00431 may be in contact with the source electrode 0051, the poly-Si pattern 0041, and the a-Si pattern 0042. The drain contact pattern 00432 may correspond to (or be directly under) the drain electrode 0052, and the drain contact pattern 00432 may be in contact with the drain electrode 0052, the poly-Si pattern 0041, and the a-Si pattern 0042.

In some embodiments, as shown in FIG. 2, the ohmic contact pattern 0043 may be in contact with the a-Si pattern 0042 and the poly-Si pattern 0041. That is, a portion of the ohmic contact pattern 0043 may be in contact with the a-Si pattern 0042, and another portion of the ohmic contact pattern 0043 may be in contact with the poly-Si pattern 0041. Specifically, the source contact pattern 00431 and the drain contact pattern 00432 may each be in contact with the poly-Si pattern 0041 and the a-Si pattern 0042. When the TFT is turned on, the current from the source electrode 0051 may substantially flow through the source contact pattern 00431, the poly-Si pattern 0041, the drain contact pattern 00432, and reach the drain electrode 0052. When the TFT is turned off, the current from the drain electrode 0052 may substantially flow through the drain contact pattern 00432, the a-Si pattern 0042, the source contact pattern 00431, and reach the source electrode 0051. The specific positions and contact areas between the ohmic contact pattern 0043 and the poly-Si pattern 0041/a-Si pattern 0042 should not be limited by the embodiments of the present disclosure.

In some embodiments, the orthogonal projection of the a-Si pattern 0042 on the substrate 001 may be located in the orthogonal projection of the poly-Si pattern 0041 on the substrate 001. Thus, the ohmic contact pattern 0043 may be in contact with the a-Si pattern 0042 and the poly-Si pattern 0041, respectively.

In some embodiments, the orthogonal projection of the ohmic contact pattern 0043 on the substrate 001 may at least substantially overlap with the orthogonal projection of the source-drain layer 005 on the substrate 001. In one embodiment, the orthogonal projection of the ohmic contact pattern 0043 on the substrate 001 may completely overlap with the orthogonal projection of the source-drain layer 005 on the substrate 001. The orthogonal projection of the poly-Si pattern 0041 on the substrate 001 may at least substantially overlap with the orthogonal projection of the gate electrode 002 on the substrate 001. In one embodiment, the orthogonal projection of the poly-Si pattern 0041 on the substrate 001 may completely overlap with the orthogonal projection of the gate electrode 002 on the substrate 001.

In some embodiments, the center of the orthogonal projection of the a-Si pattern 0042 on the substrate 001 may at least substantially overlap with the center of the orthogonal projection of the poly-Si pattern 0041 on the substrate 001. In one embodiment, the center of the orthogonal projection of the a-Si pattern 0042 on the substrate 001 may completely overlap with the center of the orthogonal projection of the poly-Si pattern 0041 on the substrate 001. It should be noted that, the term "center" may represent the geometric center, the approximate geometric center, or any suitable location of a regular or irregular shape, e.g., an orthogonal projection, depending on various embodiments.

In some embodiments, in the disclosed embodiments, the gate electrode 002 and the source-drain layer 005 may be made of suitable metal materials. For example, the gate electrode 002 and the source-drain layer 005 may be made of Mo, Cu, Al, and/or other suitable alloys. The GI layer 003 may be made of silicon dioxide, silicon nitride, a mixture of silicon dioxide and silicon nitride, and other suitable dielectric materials. The specific materials to form the gate electrode 002, the source-drain layer 005, and the GI layer 003 should not be limited by the embodiments of the present disclosure.

In the TFT 00 shown in FIG. 2, the gate electrode 002 may control the on and off states of the TFT 00. When the TFT 00 is turned on, the current from the source electrode 0051 may substantially flow through the source contact pattern 00431, the poly-Si pattern 0041, and the drain contact pattern 00432 to reach the drain electrode 0052. When the TFT is turned off, the current from the drain electrode 0052 may substantially flow through the drain contact pattern 00432, the a-Si pattern 0042, and the source contact pattern 00431 to reach the source electrode 0051. Because the electron mobility of the poly-Si pattern 0041 may be relatively high, and the electron mobility of the a-Si pattern 0042 may be relatively low, when the TFT 00 is turned on, the current from the source electrode 0051 may reach the drain electrode 0052 through the poly-Si pattern 0041, and when the TFT 00 is turned off the current from the drain electrode 0052 may reach the source electrode 0051 through the a-Si pattern 0042. Thus, the on-state current of the TFT 00 may be increased, and the off-state current of the TFT 00 may be decreased.

Thus, in the disclosed TFT, because the source electrode may be in contact with the poly-Si pattern and the a-Si pattern, the drain electrode may be in contact with the poly-Si pattern and the a-Si pattern, when the TFT is turned on, the current from the source electrode may flow through the poly-Si pattern to reach the drain electrode. Further, the electron mobility of the poly-Si pattern may be relatively high, so that the on-state current of the TFT may be increased and the charging rate may be increased. The issues of low on-state current and low charging rate in the conventional TFT may be resolved. Thus, the on-state current of the TFT may be increased, and the charging rate may be improved.

In related art, the TFTs may also include low temperature poly-silicon (LTPS) TFTs. A LTPS TFT may include a substrate, and a gate electrode, an GI layer, an active layer, and a source-drain layer. The gate electrode, the GI layer, the active layer, and the source-drain layer may be formed sequentially on the substrate. The active layer may be formed through an LTPS technology. The source-drain layer may include a source electrode and a drain electrode. The source electrode and the drain electrode may each be in contact with the active layer. Because the electron mobility of the p-Si is relatively high (often hundreds of times higher than a-Si), the LTPS TFT may have relatively high on-state current and may have a relatively high charging rate. However, an LTPS TFT may have undesirably high off-state current, which affects the performance of the LTPS TFT. By using the disclosed TFT, the source electrode and the drain electrode may each be in contact with the poly-Si pattern and the a-Si pattern. When the TFT is turned off the current from the drain electrode may flow through the a-Si pattern to reach the source electrode, to release the charges on the drain electrode. The electron mobility of the a-Si pattern may be relatively low. Thus, the off-state current of the TFT may be reduced.

In related art, to ensure the charging rate of an a-Si TFT, the dimensions of the a-Si TFT are often designed to be sufficiently large. As a result, the aperture ratio of the pixel unit containing the a-Si TFT may be significantly affected. Such a-Si TFTs may limit the development of products with high resolution and narrow bezel. Using the disclosed TFTs, the aperture ratio of the pixel unit may be ensured, and the charging rate of the TFT may be improved. Thus, the disclosed TFTs may be suitable for the development of products with high resolution and narrow bezel.

Embodiments of the present disclosure further provide a method for fabricating the disclosed TFT. The method and principles to fabricate the disclosed TFT may be described in connection with the following embodiments.

Figure 3:
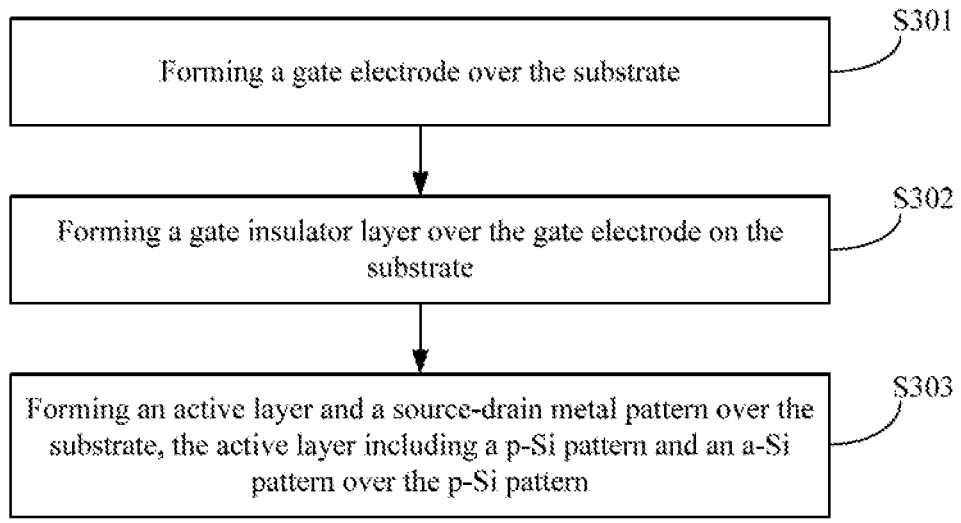
FIG. 3 illustrates a flow chart of an exemplary process to fabricate a TFT according to various disclosed embodiments of the present disclosure.

FIG. 3 illustrates a flow chart of an exemplary process to fabricate the disclosed TFT. The process shown in FIG. 3 may be used to form an exemplary structure shown in FIGS. 1 and 2. As shown in FIG. 3, the process may include steps S301-S302.

In step S301, a gate electrode may be formed over a substrate.

In step S302, a GI layer may be formed over the gate electrode on the substrate.

In step S303, an active layer and a source-drain layer may be formed over the substrate. The active layer may include a poly-Si pattern and an a-Si pattern over the poly-Si pattern.

The source-drain layer may include a source electrode and a drain electrode. The source electrode and the drain electrode may each be in contact with the poly-Si pattern and the a-Si pattern.

In the disclosed TFT, the source electrode and the drain electrode may each be in contact with the poly-Si pattern and the a-Si pattern. When the TFT is turned on, the current from the source electrode may flow through the poly-Si pattern to reach the drain electrode, and the electron mobility of the poly-Si pattern may be relatively high. Thus, the on-state current of the TFT may be increased, and the charging rate may be improved. The issues of low on-state current and low charging rate in the conventional TFT may be resolved. Thus, the on-state current of the TFT may be increased, and the charging rate may be improved.

In some embodiments, the active layer may include an ohmic contact pattern over the a-Si pattern and the poly-Si pattern. The ohmic contact pattern may include a source contact pattern and a drain contact pattern. The source contact pattern may not be in contact with the drain contact pattern. The source contact pattern may be in contact with the source electrode, the poly-Si pattern, and the a-Si pattern. The drain contact pattern may be in contact with the drain electrode, the poly-Si pattern, and the a-Si pattern.

In some embodiments, step S303 may include the following steps.

First, a poly-Si material layer may be formed over the GI layer on the substrate. Further, a first a-Si layer may be formed over the poly-Si material layer on the substrate. Further, a patterning process may be performed on the first a-Si layer to obtain the a-Si pattern. Further, an ohmic contact layer and a source-drain metal layer may be sequentially formed over the a-Si pattern on the substrate. Further, another patterning process may be performed on the source-drain metal layer, the ohmic contact layer, and the poly-Si material layer to obtain the source-drain layer, the ohmic contact pattern, and the poly-Si pattern.

In some embodiments, performing a patterning process on the source-drain metal layer, the ohmic contact layer, and the poly-Si material layer to obtain the source-drain layer, the ohmic contact pattern, and the poly-Si pattern may include the following steps.

First, a photoresist layer may be formed over the source-drain metal layer on the substrate. Further, a halftone mask may be applied over the photoresist layer, on the substrate, to expose the photoresist layer, and the exposed photoresist layer may be developed to obtain a photoresist pattern. The photoresist pattern may include a first photoresist region, a second photoresist region, and a photoresist-fully-removed region. The first photoresist region may correspond to the to-be-formed source-drain layer, the second photoresist region may correspond to the region between the source electrode and the drain electrode in the to-be-formed source-drain layer, and the photoresist-fully-removed region may correspond to other regions. Further, an etching process may be performed on the portion of the source-drain metal layer, the ohmic contact layer, and the poly-Si material layer each corresponding to the photoresist-fully-removed region, to obtain the poly-Si pattern, an initial ohmic contact pattern, and an initial source-drain layer. Further, photoresist in the second photoresist region may be removed. Further, an etching process may be performed on the portion of the initial source-drain layer and the initial ohmic contact pattern each corresponding to the second photoresist region, to obtain the source-drain layer and the ohmic contact pattern. Further, the photoresist in the first photoresist region may be removed.

In some embodiments, a process to form the poly-Si material layer over the GI layer on the substrate may include the following steps. First, a second a-Si layer may be formed over the GI layer on the substrate. Further, a high-temperature dehydrogenation process may be performed on the second a-Si layer, to form a post-dehydrogenated second a-Si layer. Further, an annealing process may be performed on the post-dehydrogenated second a-Si layer, to convert the a-Si in the post-dehydrogenated second a-Si layer to p-Si. Thus, the poly-Si material layer may be obtained.

In some embodiments, performing an annealing process on the post-dehydrogenated second a-Si layer to convert the a-Si in the post-dehydrogenated second a-Si layer to p-Si may include the following steps. First, the annealing process may be performed on the region, of the post-dehydrogenated second a-Si layer and corresponding to the gate electrode, to convert the a-Si in the region to p-Si. Thus, a poly-Si material layer may be obtained. The poly-Si material layer may include a p-Si region and an a-Si region. The orthogonal projection of the photoresist-fully-removed region on the substrate may at least substantially overlap with the orthogonal projection of the a-Si region on the substrate. In some embodiments, the orthogonal projection of the photoresist-fully-removed region on the substrate may fully overlap with the orthogonal projection of the a-Si region on the substrate.

In some embodiments, the ohmic contact layer may be in contact with the a-Si pattern and the poly-Si pattern. The orthogonal projection of the a-Si pattern on the substrate may be within the orthogonal projection of the poly-Si pattern on the substrate. The orthogonal projection of the ohmic contact pattern on the substrate may at least substantially overlap with the orthogonal projection of the source-drain layer on the substrate. The orthogonal projection of the poly-Si pattern on the substrate may at least substantially overlap with the orthogonal projection of the gate electrode on the substrate.

In some embodiments, the center of the orthogonal projection of the a-Si pattern on the substrate may at least substantially overlap with the center of the orthogonal projection of the poly-Si pattern on the substrate.

In some embodiments, the material to form the ohmic contact pattern may include n+ a-Si.

The technical solutions provided above may be used to form any suitable structures in various embodiments of the present disclosure. Details are not repeated herein.

Thus, in the disclosed method to form the TFT, the source electrode and the drain electrode may each be in contact with the poly-Si pattern and the a-Si pattern. When the TFT is turned on, the current from the source electrode may flow through the poly-Si pattern to reach the drain electrode. Because the electron mobility of the poly-Si pattern is sufficiently high, the on-state current of the TFT may be increased, and the charging rate may be increased accordingly. The issues of low on-state current and low charging rate in the conventional TFT may be resolved. Thus, the on-state current of the TFT may be increased, and the charging rate may be improved.

Figure 4:
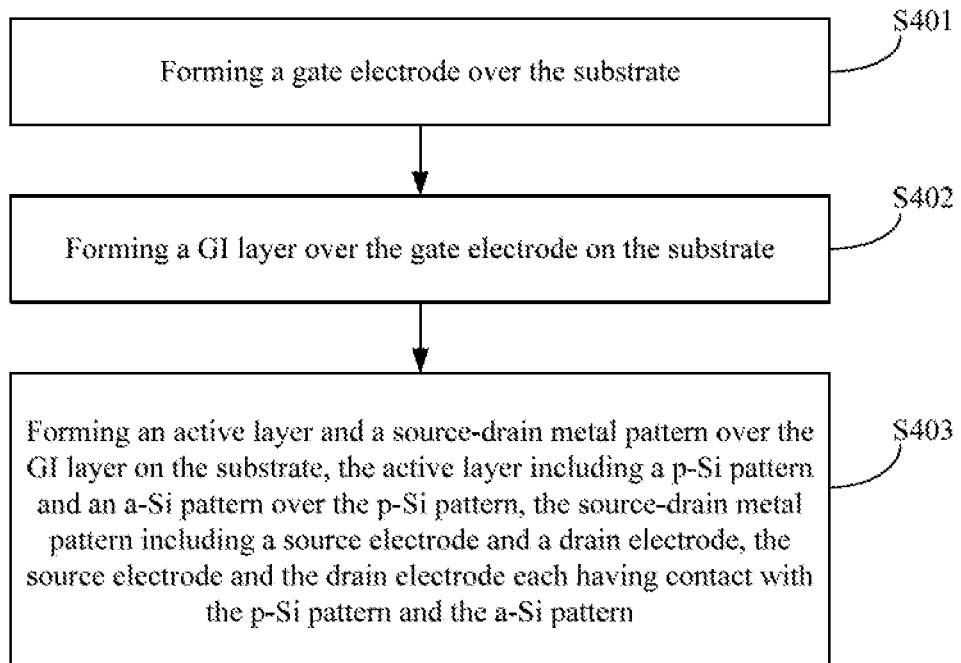
FIG. 4 illustrates a flow chart of another exemplary process to fabricate a TFT according to various disclosed embodiments of the present disclosure.

FIG. 4 illustrates another exemplary process to form a disclosed TFT. An exemplary structure of the TFT, formed using the process in FIG. 4, may be shown in FIG. 2. As shown in FIG. 4, the process may include steps S401-S403.

In step S401, a gate electrode may be formed over the substrate.

Figure 5:
FIG. 5 illustrates a structure during an exemplary fabrication process of a TFT according to various disclosed embodiments of the present disclosure.

FIG. 5 illustrates an exemplary structure of a gate electrode 002 formed over the substrate 001. The substrate 001 may be transparent, and may be made of a suitable solid non-metal material having a desired light transmission rate and desired hardness. For example, the substrate 001 may be made of glass, quartz, transparent resin, and other suitable materials. The gate electrode 002 may be made of a metal material. For example, the gate electrode 002 may be made of Mo, Cu, Al, and other suitable alloys. The thickness of the gate electrode 002 may be determined to be in a suitable range, according to practical fabrication requirements. The specific thickness of the gate electrode 002 should not be limited by the embodiments of the present disclosure.

In some embodiments, magnetron sputtering, thermal evaporation, and/or plasma enhanced chemical vapor deposition (PECVD) may be used to deposit a suitable metal material with a desired thickness over the substrate 001, to form a metal material layer. A patterning process may be performed on the metal material layer to obtain the gate electrode 002.

The patterning process may include photoresist coating, exposure, development, etching, and photoresist removal. Accordingly, performing a patterning process on the metal material layer to obtain the gate electrode 002 may include the following steps. First, a photoresist layer having a desired thickness may be coated over the metal material layer, and a mask may be used to expose the photoresist layer to form a fully-exposed region and an unexposed region in the photoresist layer. Further, the exposed photoresist layer may be developed so that the photoresist in the fully-exposed region may be fully removed, and the photoresist in the unexposed region may remain. An etching process may be performed to etch the portion of the metal material layer corresponding to the fully-exposed region, and the photoresist in the unexposed region may be further removed. Thus, the portion of the metal material layer corresponding to the unexposed region may form the gate electrode 002.

For illustrative purposes, a positive photoresist is used to describe the formation of the gate electrode 002. In practice, a negative photoresist may also be used to form the gate electrode 002. The specific type of photoresist to form the gate electrode 002 should not be limited by the embodiments of the present disclosure.

In step S402, a GI layer may be formed over the gate electrode on the substrate.

Figure 6:
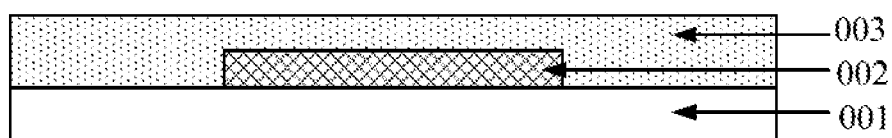
FIG. 6 illustrates a structure during an exemplary fabrication process of a TFT according to various disclosed embodiments of the present disclosure.

FIG. 6 illustrates an exemplary structure of a GI layer 003 formed over the gate electrode 002 on the substrate 001. The GI layer 003 may be made of silicon dioxide, silicon nitride, a mixture of silicon dioxide and silicon nitride, and other suitable dielectric materials. The thickness of the GI layer may be determined according to different fabrication requirements and should not be limited by the embodiments of the present disclosure.

For example, coating, magnetron sputtering, thermal evaporation, PECVD, and other suitable deposition means may be used to form a layer of silicon dioxide on the substrate 001 to form a silicon dioxide material layer. The silicon dioxide material layer may have a desired thickness. The silicon dioxide material layer may be baked to form the GI layer 003.

In various embodiments, when the GI layer 003 includes a pattern, a patterning process may be performed on the silicon dioxide material layer to form the GI layer 003. Details are not repeated herein.

In step S403, an active layer and a source-drain layer may be formed over the GI layer on the substrate. The active layer may include a poly-Si pattern and an a-Si pattern over the poly-Si pattern. The source-drain layer may include a source electrode and a drain electrode. The source electrode and the drain electrode may each be in contact with the poly-Si pattern and the a-Si pattern.

Figure 7:
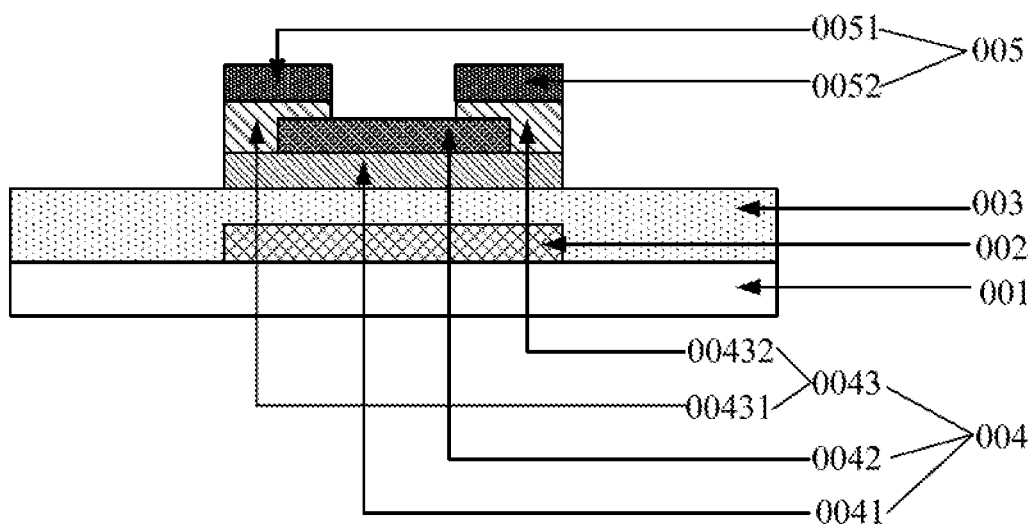
FIG. 7 illustrates another structure during an exemplary fabrication process of a TFT according to various disclosed embodiments of the present disclosure.

FIG. 7 illustrates an exemplary structure of an active layer 004 and a source-drain layer 005 formed over the GI layer 003 on the substrate. As shown in FIG. 7, the active layer 004 may include the poly-Si pattern 0041, the a-Si pattern 0042 over the poly-Si pattern 0041, and the ohmic contact pattern 0043 over the a-Si pattern 0042 and the poly-Si pattern 0043. The ohmic contact pattern 0043 may include a source contact pattern 00431 and a drain contact pattern 00432. The source-drain layer 005 may include the source electrode 0051 and the drain electrode 0052. The source contact pattern 00431 may correspond to the source electrode 0051, and the source contact pattern 00431 may be in contact with the source electrode 0051, the poly-Si pattern 004, and the a-Si pattern 0042. The drain contact pattern 00432 may correspond to the drain electrode 0052. The drain contact pattern 00432 may be in contact with the drain electrode 0052, the poly-Si pattern 0041, and the a-Si pattern 0042.

In some embodiments, as shown in FIG. 7 the ohmic contact pattern 0043 may be in contact with the a-Si pattern 0042 and the poly-Si pattern 0041. That is, a portion of the ohmic contact pattern 0043 may be in contact with the a-Si pattern 0042, and another portion of the ohmic contact pattern 0043 may be in contact with the poly-Si pattern 0041. Specific contact positions and areas should not be limited by the embodiments of the present disclosure. The orthogonal projection of the a-Si pattern 0042 on the substrate 001 may be within the orthogonal projection of the poly-Si pattern 0041 on the substrate 001. The orthogonal projection of the ohmic contact pattern 0043 on the substrate 001 may at least substantially overlap with the orthogonal projection of the source-drain layer 005 on the substrate 001. The orthogonal projection of the poly-Si pattern 0041 on the substrate 001 may substantially overlap with the orthogonal projection of the gate electrode 002 on the substrate 001. The center of the orthogonal projection of the a-Si pattern 0042 on the substrate 001 may at least substantially overlap with the center of the orthogonal projection of the poly-Si pattern 0041 on the substrate 001. In some embodiments, the material to form the ohmic contact pattern 0043 may include n+ a-Si.

Figure 8:
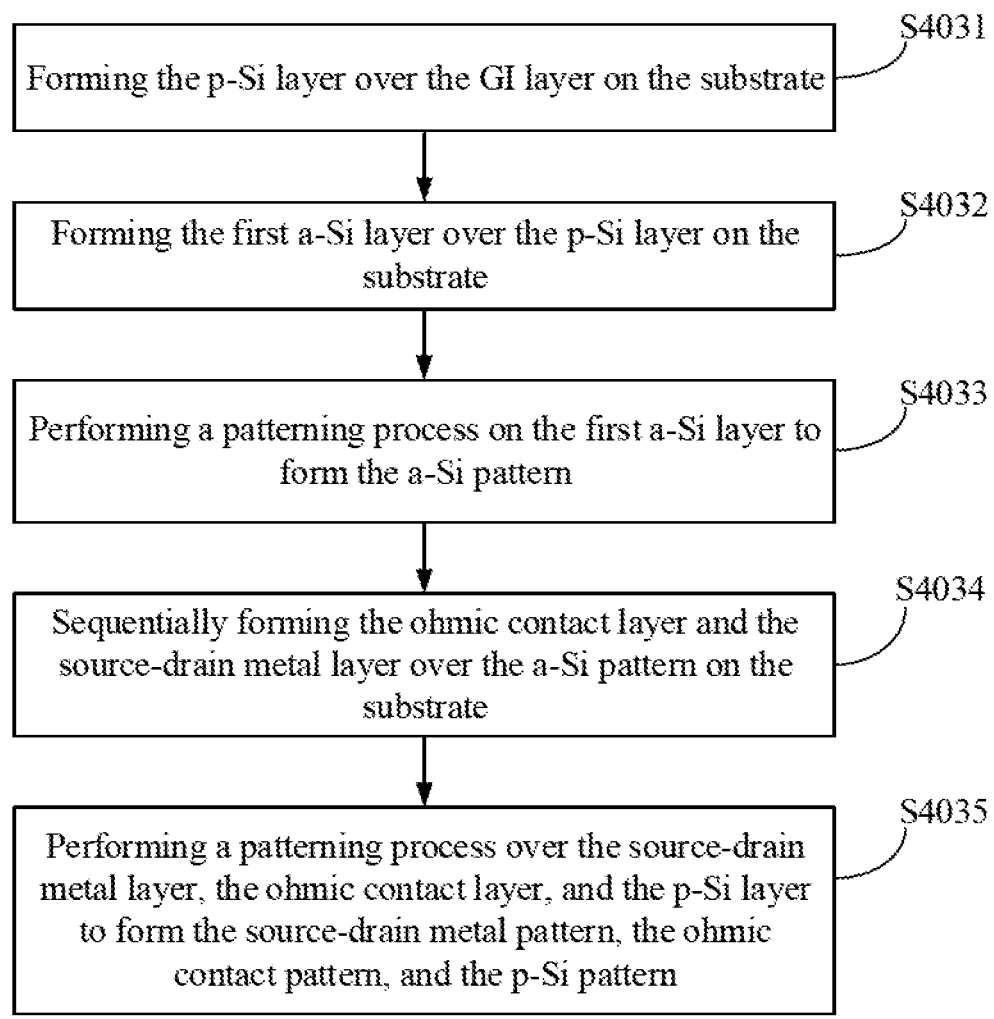
FIG. 8 illustrates a flow chart of another exemplary process to fabricate a TFT according to various disclosed embodiments of the present disclosure.

FIG. 8 illustrates a flow chart of an exemplary process to form the active layer and the source-drain layer over the GI layer on the substrate. As shown in FIG. 4-21, the process may include sub-steps S4031-S4035.

In sub-step S4031, the poly-Si material layer may be formed over the GI layer on the substrate.

Figure 9:
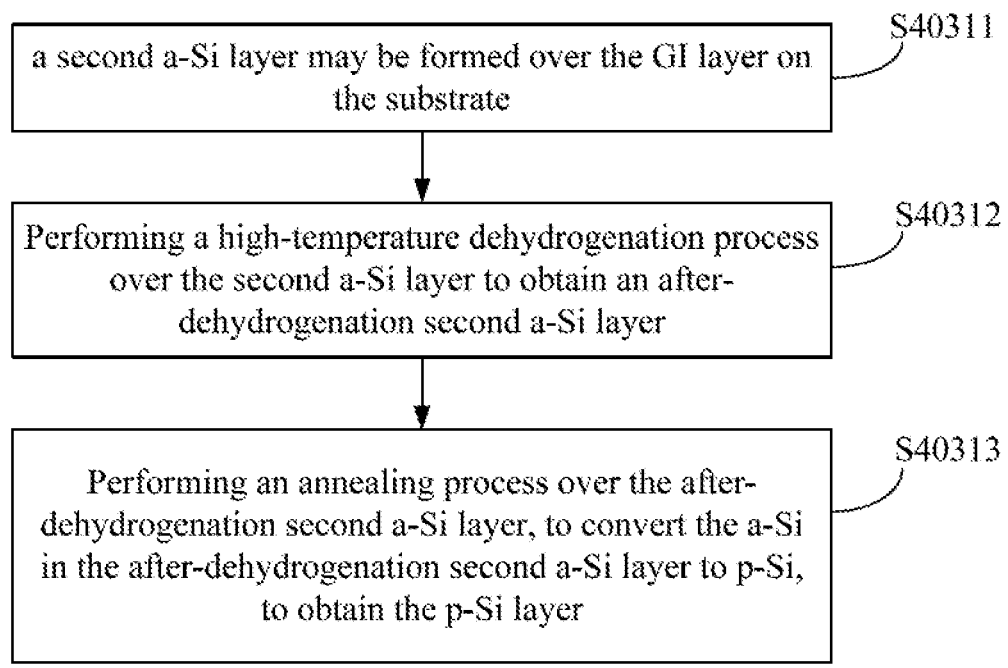
FIG. 9 illustrates a flow chart of another exemplary process to fabricate a TFT according to various disclosed embodiments of the present disclosure.

In some embodiments, FIG. 9 illustrates a flow chart of an exemplary process to form the poly-Si material layer over the GI layer on the substrate. As shown in FIG. 9, the process may include sub-steps S40311-S40313.

In sub-step S40311, a second a-Si layer may be formed over the GI layer on the substrate.

Figure 10:
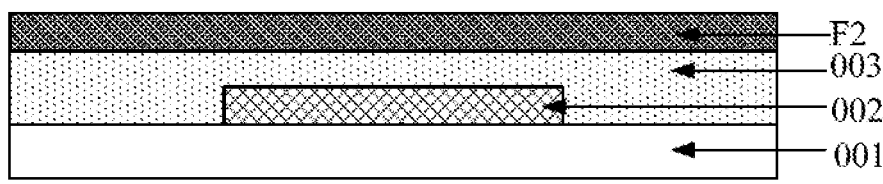
FIG. 10 illustrates another structure during an exemplary process to fabricate a TFT according to various disclosed embodiments of the present disclosure.

For example, FIG. 10 illustrates an exemplary structure of a second a-Si layer F2 formed over the GI layer 003 on the substrate 001. The thickness of the second a-Si layer F2 may be determined according to practical fabrication requirements and should not be limited by the embodiments of the present disclosure.

For example, coating, magnetron sputtering, thermal evaporation, PECVD, and/or other suitable deposition processes may be used to form a layer of a-Si over the GI layer 003 on the substrate 001. The layer of a-Si may have a desired thickness. The layer of a-Si may be baked to obtain the second a-Si layer F2.

In sub-step S40312, a high-temperature dehydrogenation process may be performed over the second a-Si layer to obtain an post-dehydrogenated second a-Si layer.

The specific high-temperature dehydrogenation process performed on the second a-Si layer F2 is not described in the present disclosure. It should be noted that, the high-temperature dehydrogenation process performed on the second a-Si layer F2 may eliminate the hydrogen atoms in the second a-Si layer F2. Thus, potential explosions caused by hydrogen atoms, in the subsequent annealing process, may be avoided.

In sub-step S40313, an annealing process may be performed over the post-dehydrogenated second a-Si layer, to convert the a-Si in the post-dehydrogenated second a-Si layer to p-Si, to obtain the poly-Si material layer.

Figure 11:
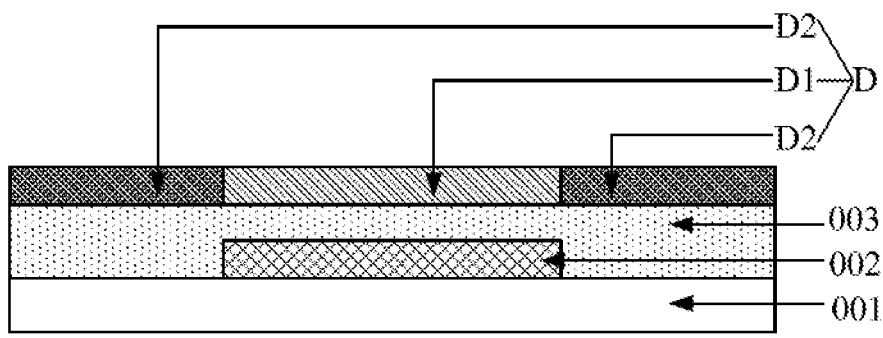
FIG. 11 illustrates another structure during an exemplary process to fabricate a TFT according to various disclosed embodiments of the present disclosure.

After the second a-Si layer F2 is dehydrogenated, the annealing process may be performed on the second a-Si layer, to convert the a-Si in the post-dehydrogenated second a-Si layer to p-Si, to obtain the poly-Si material layer. For example, FIG. 11 illustrates the structure after the annealing process is performed on the second a-Si layer. In some embodiments, a laser annealing process may be performed to treat the region in the second a-Si layer corresponding to the gate electrode 002, so that the a-Si in the treated region, corresponding to the gate electrode 002, may be converted to p-Si. The poly-Si material layer D may be obtained, as shown in FIG. 11. The poly-Si material layer D may include a p-Si region D1 and an a-Si region D2. The orthogonal projection of the p-Si region D1 on the substrate 001 may at least substantially overlap with the orthogonal projection of the gate electrode 002 on the substrate 001.

Because the area of the substrate 001 is often sufficiently large, the second a-Si layer formed over the substrate 001 may also be sufficiently large. If an annealing process is performed on the entire post-dehydrogenated second a-Si layer, the uniformity of the annealing process may be difficult to control, causing the method to fabricate TFTs not suitable to be applied to high-generation lines. The region in the post-dehydrogenated second a-Si layer corresponding to the gate electrode 002 may have a much smaller area than the post-dehydrogenated second a-Si layer. Thus, in the present disclosure, the annealing process may be performed on the region in the post-dehydrogenated second a-Si layer corresponding to the gate electrode 002, and the uniformity of the annealing process may be improved.

Accordingly, the disclosed method to fabrication TFTs can be applied in high-generation lines.

In sub-step S4032, the first a-Si layer may be formed over the poly-Si material layer on the substrate.

Figure 12:
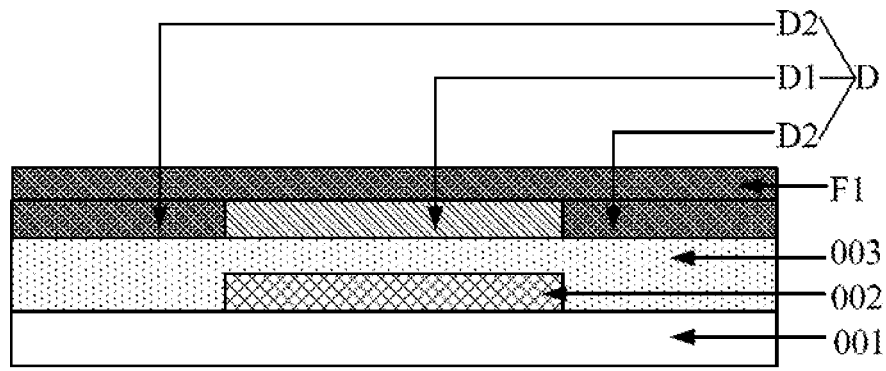
FIG. 12 illustrates another structure during an exemplary process to fabricate a TFT according to various disclosed embodiments of the present disclosure.

For example, FIG. 12 illustrates an exemplary structure of the first a-Si layer F1 formed over the poly-Si material layer D on the substrate. The formation of the first a-Si layer F1 may be referred to sub-step S40311. Details are not repeated herein.

In sub-step S4033, a patterning process may be performed on the first a-Si layer to form the a-Si pattern.

Figure 13:
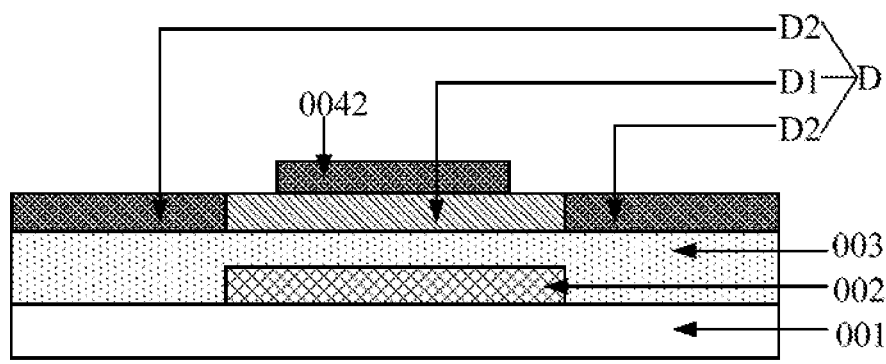
FIG. 13 illustrates another structure during an exemplary process to fabricate a TFT according to various disclosed embodiments of the present disclosure.

FIG. 13 illustrates an exemplary structure after performing the patterning process on the first a-Si layer F1. The patterning process may include photoresist coating, exposure, development, etching, and photoresist removal. Obtaining the a-Si pattern 0042, from the patterning process performed on the first a-Si layer F1, may include the following steps. First, photoresist may be coated over the first a-Si layer F1 to form a photoresist layer with a desired thickness. Further, a mask may be applied to expose the photoresist layer to form an exposed region and a non-exposed region. The photoresist layer may be further developed to fully remove the photoresist in the exposed region and retain the photoresist in the non-exposed region. An etching process may be performed to etch the portion of the first a-Si layer F1 corresponding to the exposed region. Further, the photoresist of the non-exposed region may be removed. The portion of the first a-Si layer F1 corresponding to the non-exposed region may form the a-Si pattern 0042.

In sub-step S4034, the ohmic contact layer and the source-drain metal layer may be sequentially formed over the a-Si pattern on the substrate.

Figure 14:
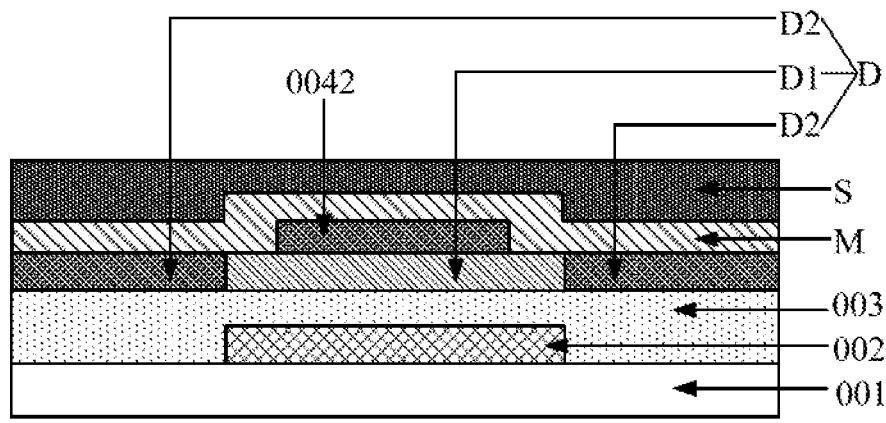
FIG. 14 illustrates another structure during an exemplary process to fabricate a TFT according to various disclosed embodiments of the present disclosure.

For example, FIG. 14 illustrates an exemplary structure after the ohmic contact layer M and the source-drain metal layer S are sequentially formed over the a-Si pattern 0042 on the substrate 001. The ohmic contact layer M may be made of n+ a-Si. The source-drain metal layer S may be made of a suitable metal material. For example, the source-drain metal layer S may be made of Mo, Cu. Al, and other suitable alloys. The specific materials to form the ohmic contact layer M and the source-drain layer S should not be limited by the embodiments of the present disclosure.

For example, magnetron sputtering, thermal evaporation, and/or PECVD may be used to form the ohmic contact layer M, having a desired thickness and made of n+ a-Si, over the a-Si pattern 0042 on the substrate 001. Further, magnetron sputtering, thermal evaporation, and/or PECVD may be used to form a layer of metal material over the ohmic contact layer M on the substrate 001, to obtain a metal material layer. The metal material layer may be used as the source-drain metal layer S.

In sub-step S4035, a patterning process may be performed over the source-drain metal layer, the ohmic contact layer, and the poly-Si material layer to form the source-drain layer, the ohmic contact pattern, and the poly-Si pattern.

The structure formed after the patterning process is performed on the source-drain metal layer S, the ohmic contact layer M, and the poly-Si material layer D may be referred to FIG. 7, and is not repeated herein.

Figure 15:
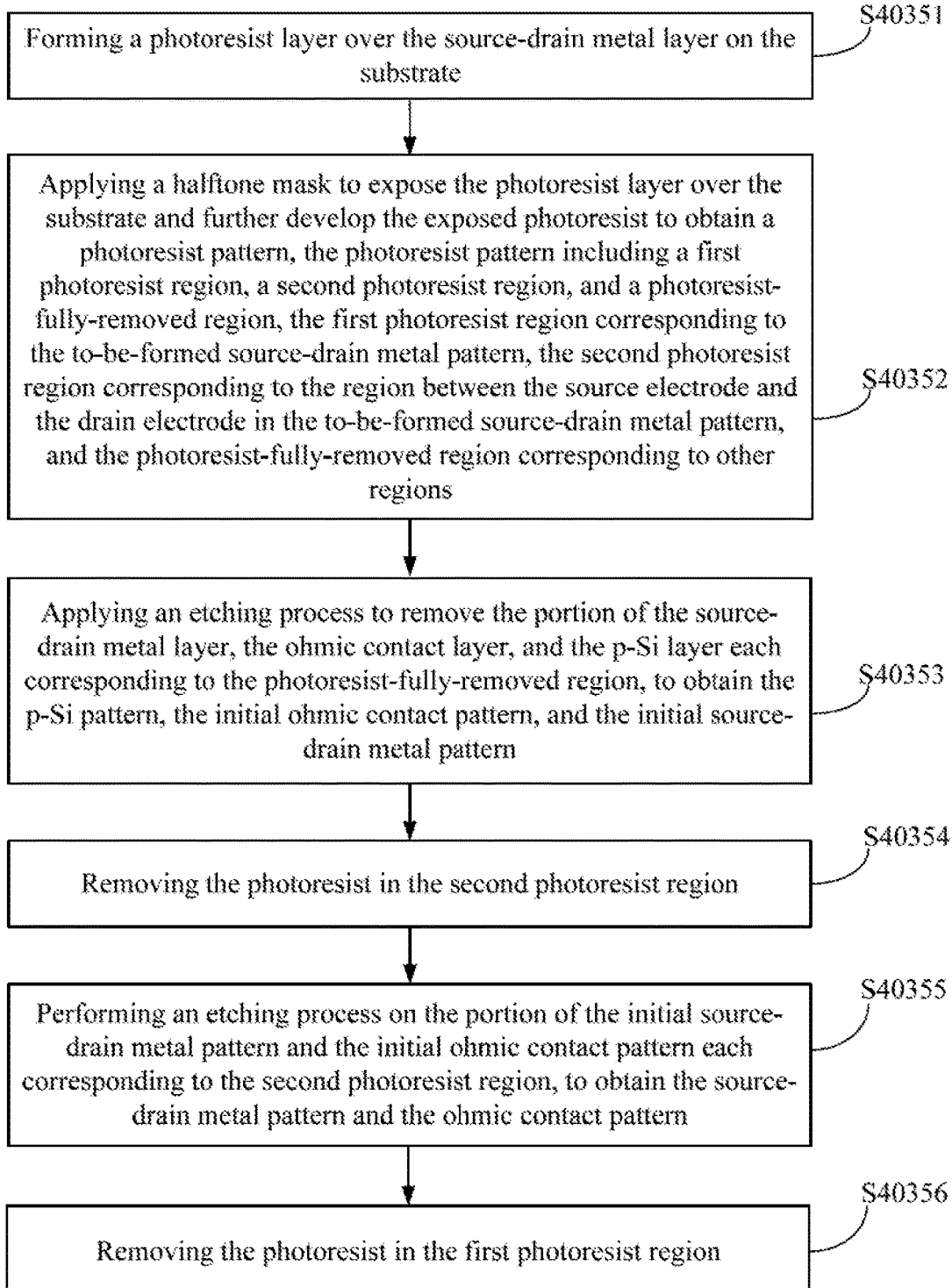
FIG. 15 illustrates a flow chart of another exemplary process to fabricate a TFT according to various disclosed embodiments of the present disclosure.

In some embodiments, as shown in FIG. 15, an exemplary process of the patterning process on the source-drain metal layer, the ohmic contact layer, and the poly-Si material layer may be shown. The process may include sub-steps S40351-S40356.

In sub-step S40351, a photoresist layer may be formed over the source-drain metal layer on the substrate.

Figure 16:
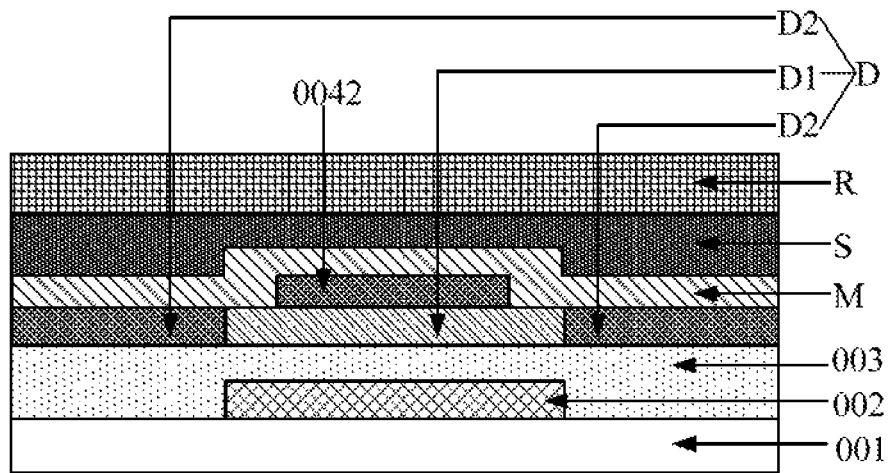
FIG. 16 illustrates another structure during an exemplary process to fabricate a TFT according to various disclosed embodiments of the present disclosure.

FIG. 16 illustrates an exemplary structure after a photoresist layer R is formed over the source-drain metal layer S on the substrate 001. The thickness of the photoresist layer R may be determined according to different applications and/or designs. The photoresist layer R may be made of a positive photoresist or a negative photoresist, depending the actual fabrication requirements/preferences. For illustrative purposes, the photoresist layer R in the embodiment may be a positive photoresist. For example, a layer of positive photoresist, having a desired thickness, may be formed over the source-drain metal layer S on the substrate 001, to form the photoresist layer R.

In sub-step S40352, a halftone mask may be applied to expose the photoresist layer over the substrate. The exposed photoresist may be developed to obtain a photoresist pattern. The photoresist pattern may include a first photoresist region, a second photoresist region, and a photoresist-fully-removed region. The first photoresist region may correspond to the to-be-formed source-drain layer, the second photoresist region may correspond to the region between the source electrode and the drain electrode in the to-be-formed source-drain layer, and the photoresist-fully-removed region may correspond to other regions.

Figure 17:
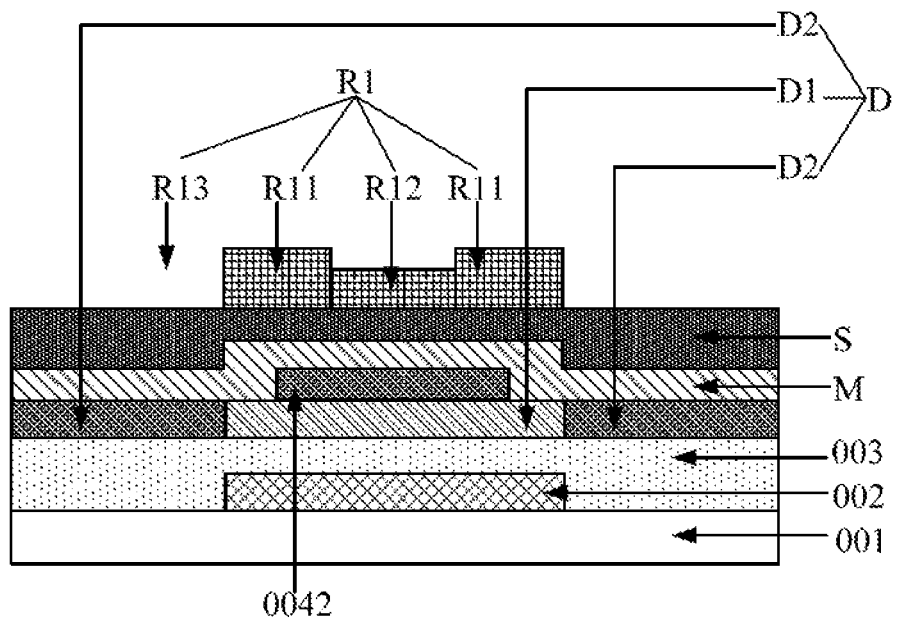
FIG. 17 illustrates another structure during an exemplary process to fabricate a TFT according to various disclosed embodiments of the present disclosure.

FIG. 17 illustrates an exemplary structure after the photoresist layer R on the substrate 001 is exposed and developed. As shown in FIG. 17, after a halftone mask is used to expose the photoresist layer R on the substrate 001, and the photoresist layer R, after exposure, is developed, a photoresist pattern R1 may be obtained. The photoresist pattern R1 may include the first photoresist region R11, the second photoresist region R12, and the photoresist-fully-removed region R13. The first photoresist region R11 may correspond to the to-be-formed source-drain layer, the second photoresist region R12 may correspond to the region between the source electrode and the drain electrode in the to-be-formed source-drain layer, and the photoresist-fully-removed region R13 may correspond to other regions.

For example, a halftone mask having a corresponding pattern may be used to expose the photoresist layer R on the substrate 001, to form a fully-exposed region, a partially-exposed region, and a non-exposed region from the photoresist layer R. Further, the exposed photoresist layer R on the substrate 001 may be developed, to remove the photoresist in the fully-exposed region, and retain the photoresist in the partially-exposed region and the non-exposed region. The photoresist pattern R1 shown in FIG. 17.

In sub-step S40353, an etching process may be applied to remove the portion of the source-drain metal layer, the ohmic contact layer, and the poly-Si material layer each corresponding to the photoresist-fully-removed region, to obtain the poly-Si pattern, the initial ohmic contact pattern, and the initial source-drain layer.

Figure 18:
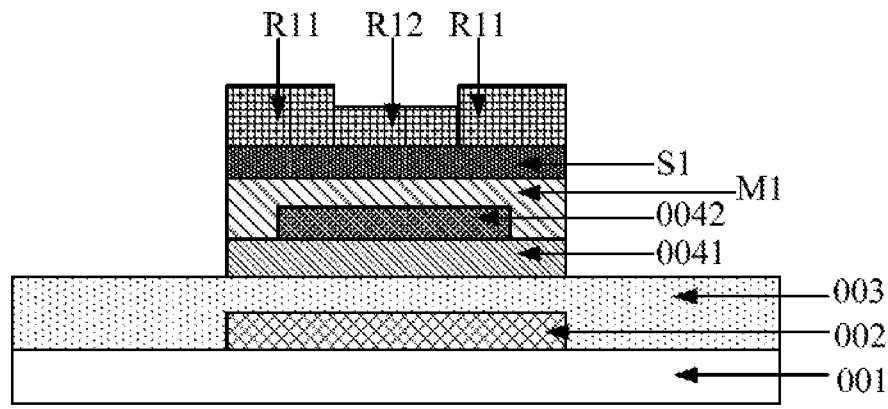
FIG. 18 illustrates another structure during an exemplary process to fabricate a TFT according to various disclosed embodiments of the present disclosure.

FIG. 18 illustrates an exemplary structure after the etching process is performed on the portion of the source-drain metal layer S, the ohmic contact layer M, and the poly-Si material layer D each corresponding to the photoresist-fully-removed region R13. As shown in FIG. 18, after the etching process is performed on the portion of the source-drain metal layer S, the ohmic contact layer M, and the poly-Si material layer D each corresponding to the photoresist-fullyremoved region R13, the initial source-drain layer Si corresponding to the source-drain metal layer S, the initial ohmic contact pattern M1 corresponding to the ohmic contact layer M, and the poly-Si pattern 0041 may be obtained. In some embodiments, during the etching process, the portion of the source-drain metal layer S, the ohmic contact layer M, and the poly-Si material layer D, each corresponding to the photoresist-fully-removed region R13, may be etched in different steps or in one step. The specific etching process should not be limited by the embodiments of the present disclosure.

In sub-step S40354, the photoresist in the second photoresist region may be removed.

Figure 19:
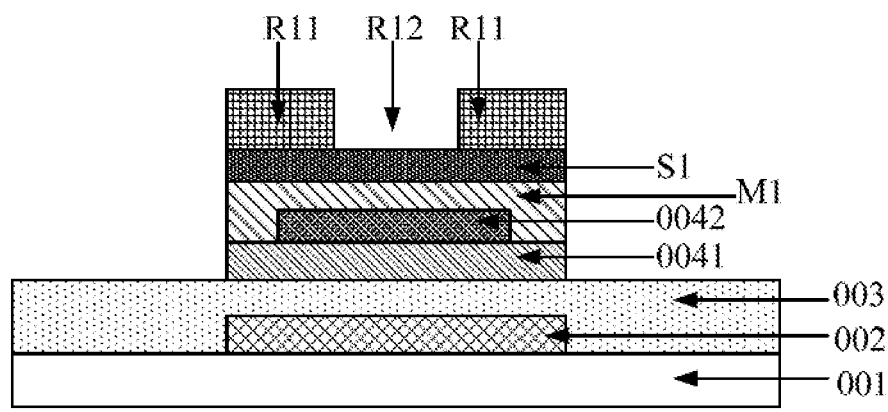
FIG. 19 illustrates another structure during an exemplary process to fabricate a TFT according to various disclosed embodiments of the present disclosure.

FIG. 19 illustrates an exemplary structure after the photoresist in the second photoresist region R12 is removed. The photoresist in the second photoresist region R12 may be removed through any suitable processes such as development, ashing, and stripping. The specific process to remove the photoresist in the second photoresist region R12 should not be limited by the embodiments of the present disclosure.

In sub-step S40355, an etching process may be performed on the portion of the initial source-drain layer and the initial ohmic contact pattern each corresponding to the second photoresist region, to obtain the source-drain layer and the ohmic contact pattern.

Figure 20:
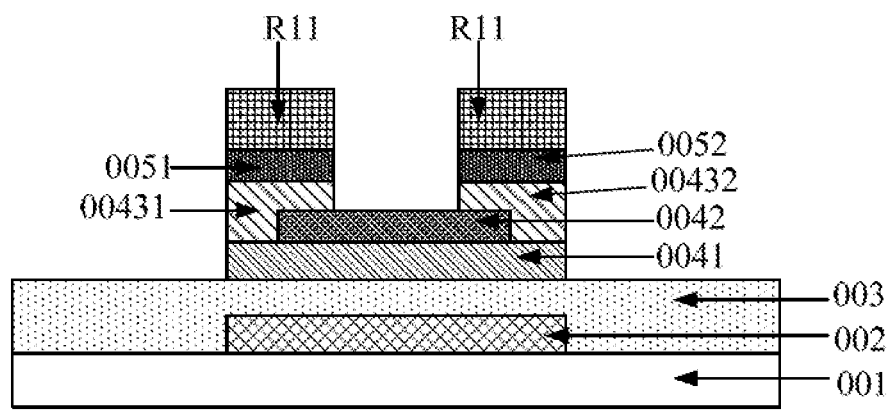
FIG. 20 illustrates another structure during an exemplary process to fabricate a TFT according to various disclosed embodiments of the present disclosure.

FIG. 20 illustrates an exemplary structure after an etching process is performed on the portion of the initial source-drain layer S1 and the initial ohmic contact pattern M1, each corresponding to the second photoresist region R12. As shown in FIG. 20, after the etching process is performed on the portion of the initial source-drain layer SI and the initial ohmic contact pattern M1, each corresponding to the second photoresist region R12, the source-drain layer and the ohmic contact pattern may be formed. The source-drain layer may include a source electrode 0051 and a drain electrode 0052. The ohmic contact pattern may include a source contact pattern 00431 and a drain contact pattern 00432. In some embodiments, during the etching process, the portion of the initial source-drain layer SI and the portion of the initial ohmic contact pattern M1 each corresponding to the second photoresist region R12, may be etched through different steps or through one step. The specific etching process should not be limited by the embodiments of the present disclosure.

In sub-step S40356, the photoresist in the first photoresist region may be removed.

The structure after the removal of the photoresist in the first photoresist region R11 may be referred to the structure shown in FIG. 7 and is not repeated herein.

The TFT formed through the disclosed method may be used in various suitable array substrates such as twisted nematic (TN) array substrates, vertical alignment (VA) array substrates, in-plane switching (IPS) array substrates, and advanced super dimension switch (ADS) array substrates.

Thus, in the disclosed method to form a TFT, the source electrode and the drain electrode may each be in contact with the poly-Si pattern and the a-Si pattern. When the TFT is turned on, the current from the source electrode may flow through the poly-Si pattern to reach the drain electrode. Because the electron mobility of the poly-Si pattern is sufficiently high, the on-state current of the TFT may be increased, and the charging rate may be increased accordingly. The issues of low on-state current and low charging rate in the conventional TFT may be resolved. Thus, the on-state current of the TFT may be increased, and the charging rate may be improved.

The TFT in related art may also include an LTPS TFT. An LTPS TFT may include a substrate, and a gate electrode, a GI layer, an active layer, and a source-drain layer sequentially formed over the substrate. The active layer may be a p-Si active layer formed through a low temperature p-Si technology. The source-drain layer may include a source electrode and a drain electrode. The source electrode and the drain electrode may each be in contact with the p-Si active layer. Because the electron mobility of p-Si is relatively high, the on-state current of an LTPS TFT may be relatively high, and the charging rate may be sufficiently high. However, the off-state current of an LTPS TFT may be relatively high, which affects the performance of the LTPS TFT. Using the disclosed method to form the TFT, the source electrode and the drain electrode may each be in contact with the poly-Si pattern and the a-Si pattern. When the TFT is turned off, the current from the drain electrode may reach the source electrode through the a-Si pattern, to release the electric charges on the drain electrode. Meanwhile, the electron mobility of the a-Si pattern may be relatively low, thus, the off-state current of the TFT may be reduced.

In related art, to ensure the charging rate of an a-Si TFT, the dimensions of the a-Si may be configured to be sufficiently large, which significantly affects the aperture ratio of the pixel unit containing the a-Si TFT. As a result, development of products with high resolution and narrow bezel may be limited. By using the disclosed TFT, the aperture ratio of the pixel unit may be ensured and the charging rate of the TFT may be further improved. Thus, the disclosed TFT is suitable for products with high resolution and narrow bezel.

The formation of active layer of an LTPS TFT, in the related art, often requires an undesirable number of fabrication steps. For example, the formation of the active layer often requires about 10 masks for patterning processes. The fabrication of the active layer may also include certain difficult processes such as laser annealing, ion implantation, high temperature processes, and activation processes such as dehydrogenation and hydrogenation. In a laser annealing process, the entire substrate needs to be annealed. Because the area of the substrate is often large, the uniformity of the laser annealing on the entire wafer can be low, causing the LTPS TFTs to be developed and produced in the six-generation line and are not suitable to be applied in high-generation lines. Also, the production yield of the LTPS TFTs is low. The investment for the production equipment of LTPS TFT can be high and the production line of LTPS TFTs has low compatibility with the production line of a-Si TFTs. In the disclosed method to form the disclosed TFT, no ion implantation and other difficult processes are needed. The fabrication of the TFT may have less steps. Also, because the annealing is performed on region of the gate electrode corresponding to the a-Si layer, the annealing process may have improved uniformity, and the production yield of the TFTs may be improved. The investment in fabrication equipment may be reduced. Further, the disclosed method to form the TFT may have improved compatibility with the production line of a-Si TFTs.

Figure 21:
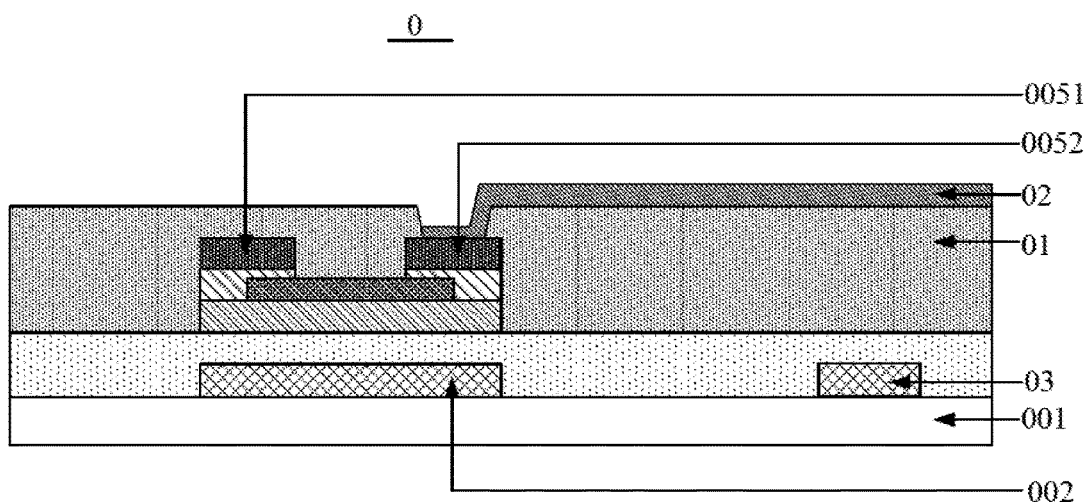
FIG. 21 illustrates an exemplary array substrate according to various disclosed embodiments of the present disclosure.

FIG. 21 illustrates an exemplary structure of a disclosed array substrate. The array substrate 0 may include a TFT as shown in FIG. 1 or FIG. 2.

Further, a passivation layer 01 may be formed over the substrate 001, containing the TFT. A via hole (not shown in FIG. 21) may be formed in the passivation layer 01. A pixel electrode 02 may be formed over the passivation layer 01 on the substrate 001. The pixel electrode 02 may be in contact with the drain electrode 0052 through the via hole.

In some embodiments, the array substrate 0 may include a gate line (not shown in FIG. 21), a data line (not shown in FIG. 21), and a common electrode line 03. The gate line may be connected to or coupled to the gate electrode 002 of the TFT. The data line may be connected to the source electrode 0051 of the TFT. The common electrode line may be connected to the common electrode. The common electrode may be arranged on the array substrate 0. The gate line, the common electrode line 03, and the gate electrode 002 may be formed through a same patterning process. The specific fabrication steps to form the abovementioned elements should not be limited by the embodiments of the present disclosure. In the present disclosure, the terms "coupled to" and "connected to" may be interchangeable. One object may be coupled to another object through any suitable types of couplings, electrical couplings, mechanical couplings, magnetic couplings, etc.

The passivation layer 01 may be made of a suitable dielectric material, e.g., silicon dioxide and/or silicon nitride. The pixel electrode 02 may be made of materials such as indium tin oxide (ITO) and/or indium zinc oxide (IZO). For example, the passivation layer 01 may be formed through magnetron sputtering, thermal evaporation, and/or PECVD. Further, a patterning process may be performed to form the via hole in the passivation layer 01. Further, magnetron sputtering, thermal evaporation, and/or PECVD may be used to deposit a layer for forming the pixel electrode, e.g., ITO or IZO. An ITO layer, as an example, over the passivation layer 01 on the substrate 001, may have a desired thickness. Thus, the ITO material layer may be obtained. Further, a patterning process may be performed on the ITO material layer to obtain the pixel electrode 02. The specific fabrication steps to form the abovementioned elements should not be limited by the embodiments of the present disclosure.

Thus, in the disclosed array substrate, the source electrode and the drain electrode may each be in contact with the poly-Si pattern and the a-Si pattern. When the TFT is turned on, the current from the source electrode may flow through the poly-Si pattern to reach the drain electrode. Because the electron mobility of the poly-Si pattern is sufficiently high, the on-state current of the TFT may be increased, and the charging rate may be increased accordingly. The issues of low on-state current and low charging rate in the conventional TFT may be resolved. Thus, the on-state current of the TFT may be increased, and the charging rate may be improved.

The present disclosure may further include a display apparatus. The display apparatus may include the array substrate shown in FIG. 21. The display apparatus may include a liquid crystal panel, an electronic paper, a mobile phone, a tablet computer, a TV, a monitor, a laptop computer, a digital photo frame, a navigation apparatus, or any products or parts with display functions.

Thus, in the disclosed display apparatus, the source electrode and the drain electrode, of the array substrate, may each be in contact with the poly-Si pattern and the a-Si pattern. When the TFT is turned on, the current from the source electrode may flow through the poly-Si pattern to reach the drain electrode. Because the electron mobility of the poly-Si pattern is sufficiently high, the on-state current of the TFT may be increased, and the charging rate may be increased accordingly. The issues of low on-state current and low charging rate in the conventional TFT may be resolved. Thus, the on-state current of the TFT may be increased, and the charging rate may be improved.

It should be understood by the those skilled in the art that, part or all of the disclosed embodiments may be implemented through suitable hardware, or computer programs to control related hardware. The computer programs may be stored in computer readable storage medium. The storage medium may be a read-only-memory (ROM), a disk, a compact disk (CD), etc.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A thin film transistor (TFT), comprising:
    a substrate;
    a source-drain layer comprising a source electrode and a drain electrode over the substrate; and
    an active layer comprising a poly-Si pattern and an amorphous-Si pattern having contact with the poly-Si pattern over the substrate, wherein:
    the amorphous-Si pattern is between the poly-Si pattern and the source-drain layer,
    the source electrode overlaps with the poly-Si pattern and the amorphous-Si pattern respectively in a direction substantially perpendicular to a surface of the substrate,
    the drain electrode overlaps with the poly-Si pattern and the amorphous-Si pattern respectively in the direction substantially perpendicular to the surface of the substrate,
    an orthogonal projection of the source electrode on the substrate is entirely within an orthogonal projection of the poly-Si pattern, and an orthogonal projection of the drain electrode on the substrate is entirely within the orthogonal projection of the poly-Si pattern, and a first horizontal portion surface of the poly-Si pattern away from the substrate is covered by the amorphous-Si pattern in the direction substantially perpendicular to the surface of the substrate and a second horizontal portion surface of the poly-Si pattern away from the substrate is exposed by the amorphous-Si pattern in the direction substantially perpendicular to the surface of the substrate.

2. The TFT according to claim 1, wherein:
an orthogonal projection of the amorphous-Si pattern on the substrate is within an orthogonal projection of the poly-Si pattern on the substrate.

3. The TFT according to claim 1, wherein:
a first portion of the poly-Si pattern is covered by the amorphous-Si pattern in the direction substantially perpendicular to the surface of the substrate and a second portion of the poly-Si pattern is exposed by the amorphous-Si pattern in the direction substantially perpendicular to the surface of the substrate; and
a first portion of the source electrode overlaps with the first portion of the poly-Si pattern and a second portion of the source electrode overlaps with the second portion of the poly-Si pattern, and a first portion of the drain electrode overlaps with the first portion of the poly-Si pattern and a second portion of the drain electrode overlaps with the second portion of the poly-Si pattern.

4. The TFT according to claim 1, wherein
the source electrode is in contact with the poly-Si pattern and the amorphous-Si pattern respectively; and
the drain electrode is in contact with the poly-Si pattern and the amorphous-Si pattern respectively.

5. The TIT according to claim 1, further comprising an ohmic contact layer comprising a source contact pattern and a drain contact pattern between the active layer and the source-drain layer, wherein:
the source contact pattern is in contact with each of the source electrode, the poly-Si pattern and the amorphous-Si pattern, and
the drain contact pattern is in contact with each of the drain electrode, the poly-Si pattern, and the amorphous-Si pattern.

6. The TIT according to claim 5, wherein:
an orthogonal projection of the source contact pattern on the substrate substantially overlaps with an orthogonal projection of the source electrode on the substrate;
an orthogonal projection of the drain contact pattern on the substrate substantially overlaps with an orthogonal projection of the drain electrode on the substrate.

7. The TFT according to claim 5, wherein the source contact pattern and the drain contact pattern are made of a material including n+ amorphous-Si.

8. The TIT according to claim 1, further comprising a gate electrode, wherein an orthogonal projection of the poly-Si pattern on the substrate substantially overlaps with an orthogonal projection of the gate electrode.

9. An array substrate, comprising a TIT according to claim 1.

10. A display apparatus, comprising the array substrate according to claim 9.

11. A method for forming a thin film transistor (TFT), comprising:
forming a substrate;
forming a source-drain layer having a source electrode and a drain electrode over the substrate; and
forming an active layer comprising a poly-Si pattern and an amorphous-Si pattern having contact with the poly-Si pattern over the substrate, wherein:

the amorphous-Si pattern is between the poly-Si pattern and the source-drain layer,
the source electrode overlaps with the poly-Si pattern and the amorphous-Si pattern respectively in a direction substantially perpendicular to a surface of the substrate,
the drain electrode overlaps with the poly-Si pattern and the amorphous-Si pattern respectively in the direction substantially perpendicular to the surface of the substrate,
an orthogonal projection of the source electrode on the substrate is entirely within an orthogonal projection of the poly-Si pattern, and an orthogonal projection of the drain electrode on the substrate is entirely within the orthogonal projection of the poly-Si pattern, and
a first horizontal portion surface of the poly-Si pattern away from the substrate is covered by the amorphous-Si pattern in the direction substantially perpendicular to the surface of the substrate and a second horizontal portion surface of the poly-Si pattern away from the substrate is exposed by the amorphous-Si pattern in the direction substantially perpendicular to the surface of the substrate.

12. The method according to drain 11, further comprising:
forming an ohmic contact layer having a source contact pattern and a drain contact pattern between the active layer and the source-drain layer, wherein:
the source contact pattern is in contact with each of the source electrode, the poly-Si pattern, and the amorphous-Si pattern, and
the drain contact pattern is in contact with each of the drain electrode, the poly-Si pattern, and the amorphous-Si pattern.

13. The method according to drain 12, forming the active layer over the substrate comprises:
forming a poly-Si layer on the substrate;
forming a first amorphous-Si layer over the poly-Si layer;
performing a patterning process on the first amorphous-Si layer to form the amorphous-Si pattern;
sequentially forming an ohmic contact material layer and a source-drain metal layer over the amorphous-Si pattern; and
performing a patterning process over the source-drain metal layer, the ohmic contact material layer, and the poly-Si layer to form the source-drain layer, the source contact pattern, the drain contact pattern, and the poly-Si pattern.

14. The method according to claim 13, wherein performing a patterning process over the source-drain metal layer, the ohmic contact material layer, and the poly-Si layer to form the source-drain layer, the source contact pattern, the drain contact pattern, and the poly-Si pattern comprises:
forming a photoresist layer over the source-drain metal layer;
applying a halftone mask over the photoresist layer to obtain a photoresist pattern, the photoresist pattern including a first photoresist region, a second photoresist region, and a photoresist-fully-removed region, the first photoresist region corresponding to a to-be-formed source-drain layer, the second photoresist region corresponding to a region between the source electrode and the drain electrode in the to-be-formed source-drain layer, and the photoresist-fully-removed region corresponding to other regions;
performing an etching process on a portion of the source-drain metal layer, the ohmic contact material layer and the poly-Si layer each corresponding to the photoresistfully-removed region, to obtain an initial ohmic contact pattern, an initial source-drain layer and the poly-Si pattern;

removing photoresist in the second photoresist region;

performing an etching process on a portion of the initial source-drain layer and the initial ohmic contact pattern each corresponding to the second photoresist region, to obtain the source-drain layer, the drain contact pattern, and the source contact pattern; and removing photoresist in the first photoresist region.

15. The method according to claim 13, wherein forming a poly-Si layer over the substrate comprises:

forming a second amorphous-Si layer on the substrate;

performing a high-temperature dehydrogenation process on the second amorphous-Si layer, to form a post-dehydrogenated second amorphous-Si layer and performing an annealing process on the post-dehydrogenated second amorphous-Si layer, to convert amorphous-Si in the post-dehydrogenated second amorphous-Si layer to poly-Si to obtain the poly-Si layer.

16. The method according to claim 15, wherein performing an annealing process on the post-dehydrogenated second amorphous-Si layer, to convert amorphous-Si in the post-dehydrogenated second amorphous-Si layer to poly-Si to obtain the poly-Si layer comprises:

performing the annealing process on a region of the post-dehydrogenated second amorphous-Si layer that is corresponding to a gate electrode to convert amorphous-Si in the region to poly-Si and obtain the poly-Si layer, the poly-Si layer including a poly-Si region and an amorphous-Si region, wherein an orthogonal projection of the photoresist-fully-removed region on the substrate substantially overlaps with an orthogonal projection of the amorphous-Si region on the substrate.

17. The method according to claim 12, wherein an orthogonal projection of the amorphous-Si pattern on the substrate is located within an orthogonal projection of the poly-Si pattern on the substrate; an orthogonal projection of the source contact pattern on the substrate substantially overlaps with an orthogonal projection of the source electrode on the substrate; and an orthogonal projection of the drain contact pattern on the substrate substantially overlaps with an orthogonal projection of the drain electrode on the substrate.

18. The method according to claim 11, wherein the source contact pattern and the drain contact pattern are made of a material including n+ amorphous-Si.

19. A thin film transistor (TFT), comprising:

a substrate;

a source-drain layer comprising a source electrode and a drain electrode over the substrate; and an active layer comprising a poly-Si pattern and an amorphous-Si pattern having contact with the poly-Si pattern over the substrate, wherein:

the amorphous-Si pattern is between the poly-Si pattern and the source-drain layer, the source electrode overlaps with the poly-Si pattern and the amorphous-Si pattern respectively in a direction substantially perpendicular to a surface of the substrate, the drain electrode overlaps with the poly-Si pattern and the amorphous-Si pattern respectively in the direction substantially perpendicular to the surface of the substrate, and a first horizontal portion surface of the poly-Si pattern away from the substrate is covered by the amorphous-Si pattern in the direction substantially perpendicular to the surface of the substrate and a second horizontal portion surface of the poly-Si pattern away from the substrate is exposed by the amorphous-Si pattern in the direction substantially perpendicular to the surface of the substrate.

* * * * *